United States Patent [19]

Selcuk

[11] Patent Number: 5,610,512

[45] Date of Patent: Mar. 11, 1997

[54] CLAMP-ON ELECTRICAL MEASURING DEVICE

[75] Inventor: Ahmet Selcuk, Manchester, England

[73] Assignee: LEM Heme Limited, Skelmersdale, England

[21] Appl. No.: 224,129

[22] Filed: Apr. 5, 1994

Related U.S. Application Data

[63] Continuation of Ser. No. 943,545, Sep. 11, 1992, abandoned.

[30] Foreign Application Priority Data

Sep. 12, 1991 [GB] United Kingdom ............... 9119501

[51] Int. Cl.$^6$ .................. G01R 21/00; G01R 19/00
[52] U.S. Cl. ................................... 324/127; 324/156
[58] Field of Search .................... 324/115, 116,
324/121 R, 127, 158 R, 156, 157, 96, 129;
D10/79, 78; 439/145, 136

[56] References Cited

U.S. PATENT DOCUMENTS

| | | | |
|---|---|---|---|
| D. 271,948 | 12/1983 | Kuramoto | D10/79 |
| D. 312,420 | 11/1990 | Kuramoto | D10/79 |
| D. 332,574 | 1/1993 | Chang | D10/79 |
| 2,779,927 | 1/1957 | Rudge | 324/127 |
| 3,488,586 | 1/1970 | Watrous et al. | 324/96 |
| 4,283,677 | 8/1981 | Niwa . | |
| 4,438,395 | 3/1984 | McClenahan . | |
| 4,471,355 | 9/1984 | Hardy et al. | 324/96 |
| 4,502,004 | 2/1985 | Schindler . | |
| 4,513,246 | 4/1985 | Blain | 324/127 |
| 4,604,569 | 8/1986 | Tedd et al. | 324/115 |
| 4,728,887 | 3/1988 | Davis | 324/127 |
| 4,743,844 | 5/1988 | Odenheimer et al. . | |
| 4,855,671 | 8/1989 | Fernandes | 324/127 |
| 4,952,755 | 8/1990 | Engel et al. | 439/136 |
| 5,084,670 | 1/1992 | Melenote | 324/156 |
| 5,107,202 | 4/1992 | Renda . | |
| 5,166,599 | 11/1992 | Hochreuther et al. | 324/157 |

FOREIGN PATENT DOCUMENTS

| | | |
|---|---|---|
| 379371 | 4/1931 | Belgium . |
| 3511602 | 10/1986 | Germany . |
| 845461 | 8/1960 | United Kingdom . |
| 2099159 | 12/1982 | United Kingdom . |
| WO87/06352 | 10/1987 | WIPO . |

OTHER PUBLICATIONS

Toute L'Electronique, No. 525, Jun. 1987, Paris, France, pp. 57–60.

Elektronik, vol. 35, No. 8, Apr. 1986, Munchen, Germany, pp. 126–130.

*Primary Examiner*—Vinh P. Nguyen
*Attorney, Agent, or Firm*—Nikaido, Marmelstein, Murray & Oram LLP

[57] ABSTRACT

An electrical measuring device has measuring elements for fitting around an electrical conductor, so that a property associated with the conductor can be measured. The device has a display unit 13 which can be used to display information relating to the property being monitored. The measuring elements for fitting the device around the conductor include a pair of jaws 16, 17, each mounted on a body member 12 for movement with respect to the body member, so that the jaws can move towards and away from one another. A plurality of connection terminals 25, 26, 27 and 28 are provided, together with a selection mechanism arranged such that, when at least one terminal is accessible, at least one other terminal is inaccessible. The device has an output terminal 29, from which an output signal can be derived, with isolation elements 35, 36 to isolate the output terminal from other components of the device, to avoid or reduce the risk that high voltages will be transmitted to the output terminal. The device is capable of measuring more than one parameter, and contains a microprocessor to enable the functionality thereof.

3 Claims, 4 Drawing Sheets

CLAMP-ON ELECTRICAL MEASURING DEVICE

This application is a continuation of application Ser. No. 07/943,545 filed Sep. 11, 1992, now abandoned.

BACKGROUND TO THE INVENTION

The invention relates to electrical measuring devices and particularly to hand-held electrical measuring devices which can be fitted around an eleclrical conductor to measure properties associated with that conductor.

DESCRIPTION OF THE PRIOR ART

A number of such devices are already known, but they are of fairly limited application.

OBJECT OF THE INVENTION

It is the object of the invention to provide a particularly versatile and sophisticated measuring device of the above type.

SUMMARY OF THE INVENTION

According to a first aspect of the invention, an electrical measuring device is provided, having means to fit the device around an electrical conductor for the measurement of a property associated with the conductor, the device having a display unit which can be used not only to display information related to the property being monitored, but also to provide an oscilloscope function.

According to a second aspect of the invention, an electrical measuring device is provided, having means for fitting the device around an electrical conductor, so that a property associated with the conductor can be measured, the means for fitting the device around the conductor comprising a pair of jaws, each mounted on a body member for movement with respect to the body member, so that the jaws can move towards and away from one another.

The device may have at least one manual operating member, for moving the jaws, the operating member being spaced away from the jaws, to reduce the risk that the hand of an operator will come into contact with the conductor.

According to a third aspect of the invention, an electrical measuring device is provided, having means for fitting the device around a conductor, so that a property associated with the conductor can be measured, the device having a plurality of connection terminals, together with mechanism arranged such that, when at least one terminal is accessible, at least one other terminal is inaccessible.

According to a fourth aspect of the invention, an electrical measuring device is provided, having means for fitting the device around an electrical conductor, to measure a property associated with the conductor the device having an output terminal, from which an output signal can be derived, there being means to isolate the output terminal from other components of the device, to avoid or reduce the risk that high voltages will be transmitted to the output terminal.

The internal components of the device may, for example, be arranged to generate an optical signal, there being sensing means to sense the optical signal and deliver it to the output terminal.

According to a fifth aspect of the invention, an electrical measuring device is provided, having means for fitting the device around an electrical conductor, to measure a property associated with the conductor, the device being capable of measuring more than one parameter, the device containing a microprocessor and having a menu-driven visual display.

Preferably, the microprocessor is controlled manually using a key pad the internal switching components being sealed from the exterior of the device by a flexible membrane.

Other objects and advantages of the invention will become apparent from the following description of a specific embodiment of the invention given by way of example only.

DESCRIPTION OF THE PREFERRED EMBODIMENT

Figure 5:
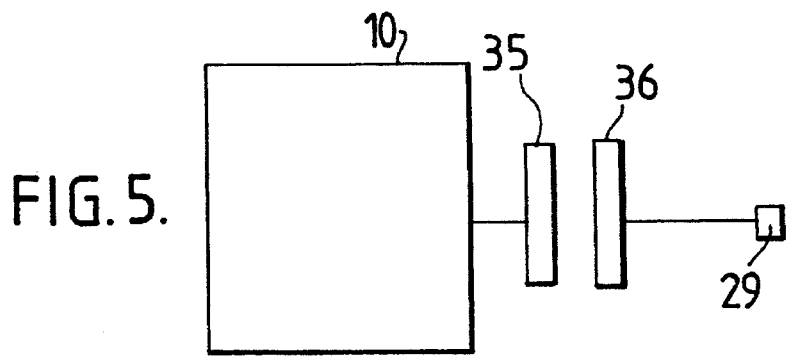
FIG. 5 shows an electrical isolation arrangement of the device.

The hand-held clip-on ammeter shown in the figures comprises microprocessor-controlled circuitry 10 (see FIG. 5) contained within a housing. The housing has a generally rectangular portion 11 for holding in the hand, and a larger portion 12 projecting therefrom, this portion having a visual display screen 13 and a battery compartment 14, which is normally closed by a cover 15.

Projecting from the portion 12 is a pair of jaws 16 and 17 which can be opened, as will be described later, by operation of a trigger 18, to clip the device around an electrical conductor. In use, the conductor will extend along the axis 19 shown in FIG. 1, and the arms 16 and 17 contain ferromagnetic material in which currents are induced by the electromagnetic field generated by the conductor.

The portion 11 of the casing also has a key pad 20, having four touch switches 21, 22, 23 and 24, the internal components of the switching mechanisms being protected from the external environment by a membrane forming part of the key pad.

On the end of the portion 11, there are four connection sockets. Sockets 25, 26 and 27 are input sockets, and socket 28 is an analogue output socket.

Input socket 25 is a voltage input terminal. Input socket 26 is a common terminal, which is used as a return terminal for all measurements except current measurement.

Input socket 27 is for use in testing ohms, continuity and diodes, as described later.

The device also has a digital output socket 29.

There is a carrying strap 30.

Figure 3:
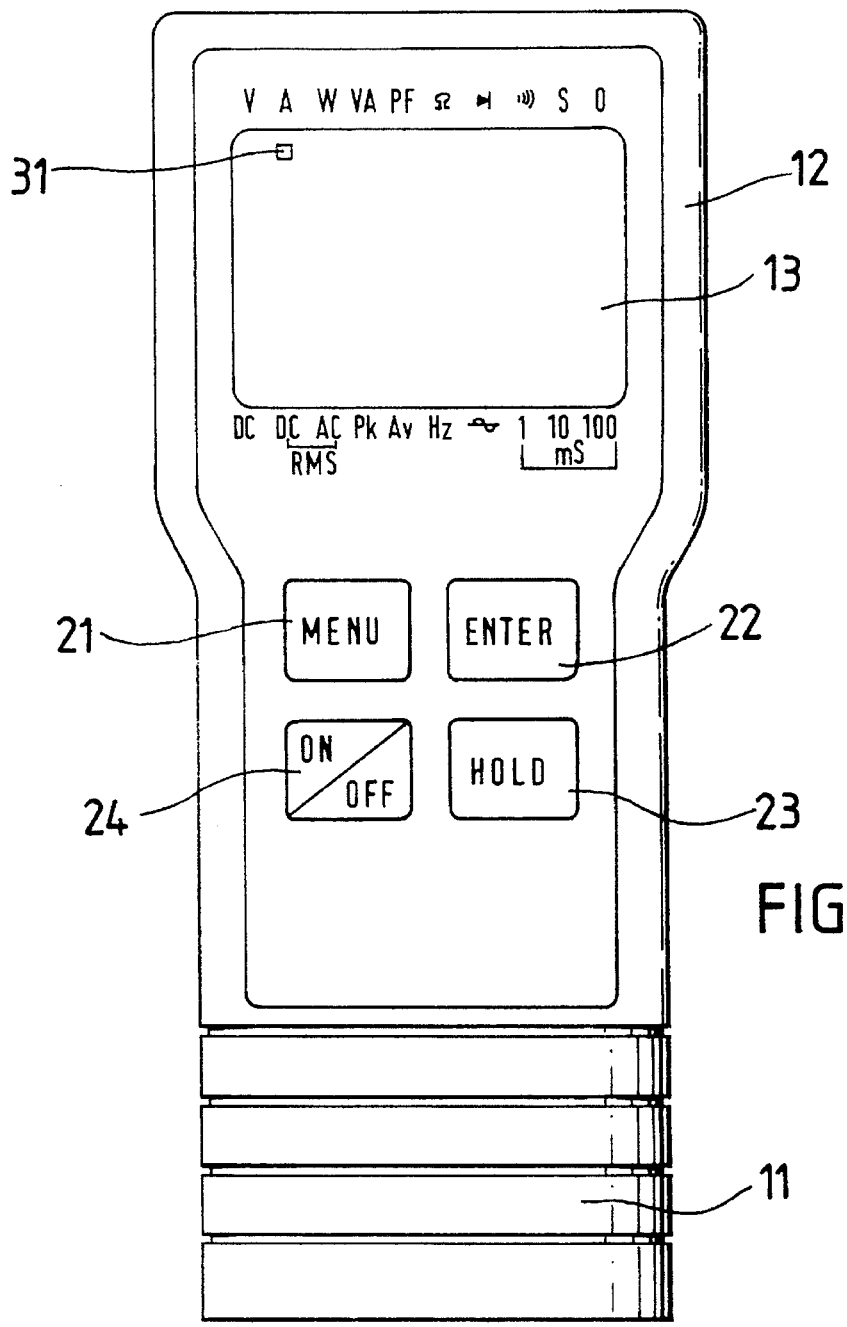
FIG. 3 is a front view of the device, showing the visual markings thereon.

An important feature of the device is that it is arranged to be extremely versatile, being capable of measuring a very large number of parameters associated with the conductor. As can be sen from FIG. 3, the parameters which can be measured are illustrated diagrammatically at the top and bottom of the screen 13.

To operate the device, after it has been clipped into position, the on/off switch 24 is pressed. When it is desired to switch the machine off again, the switch is pressed a second time.

Once the machine is on, a cursor 31 will appear on the screen. In the figure, the cursor is shown adjacent the letter A, which means that the device is set to measure amps. However, the cursor can be moved to any other desired position by depression of the menu switch 21.

Once the desired function has been located with the cursor, the enter switch 23 is depressed. If necessary for that particular function, further menu instructions will appear on the screen, making it absolutely clear ho operate the device. Once a reading has been produced on the screen, the reading at any given instant can be held for any desired period of time, by pressing the hold switch 23.

The various measurement functions will now be described in more detail.

Voltage Measurement

The cursor 31 is aligned with the letter V, as described above. Test leads are inserted into sockets 25 and 26 and the leads are applied to the circuit under test. The voltage will then be displayed on screen.

Current Measurement

The cursor 31 is aligned with the letter A. The device will then go through an auto zero calibration procedure and once this procedure has been completed, the display will show 0000. The jaws 16 and 17 are then clamped around the current carrying conductor, it being important to ensure a good contact between the closing faces of the jaws. The current will then be displayed on the screen. A polarity indication of+ on the display indicates a DC current flowing in the direction of an arrow 32 marked on the side of the casing.

Measured current values can be fed to an external device such as an oscilloscope, chart recorder or other recording instrument, via an output load fitted to analogue output socket 28.

Power Measurement

The device can be used to measure kilowatts, by putting the cursor alongside letter W, or it can be used to measure kVA, by putting the cursor alongside letters VA. An auto calibration procedure will then follow.

After the procedure is complete, test leads should be inserted into sockets 25 and 26. The jaws 16 and 17 should be clamped around the current carrying conductor and the test loads should be applied to the circuit under test. The value will then be displayed on screen, and a polarity indication of + indicates that the energy flow is in the direction of the arrow 32.

Power Factor Measurement

The letters PF are selected on the screen using the cursor. After the auto calibration procedure, leads are connected into sockets 25 and 26, the jaws are clamped around the current carrying conductor, and the leads are applied to the circuit. The power factor will then appear on the screen. Time lag is indicated by a − sign and time lead by a + sign.

Resistance Measurement

The Greek symbol indicating ohms is selected using the cursor. Leads are inserted into sockets 26 and 27. The leads are inserted across the component in the circuit to be measured and the appropriate value will appear on screen.

Diode Test

The diode symbol is selected on the screen using the cursor. The leads are fitted as for resistance measurement, arc applied across the diode under test, and the displayed value appears on the screen.

Continuity Test

A conductor can be tested for continuity, to make sure that there is not any break or fault in the conductor, by selecting the alarm signal which is shown between the diode symbol and the letter S. Leads are contacted as for resistance measurement and applied at any two desired points on the conductor. If the resistance measured is below a predetermined value, an alarm buzzer will sound.

Current Surge

The letter S is selected on the screen using the cursor, the auto calibration procedure is gone through and the jaws 16 and 17 are then clamped around the conductor. The surge current is then initiated in the conductor and the maximum RMS value of the current excursion will be stored on the display.

When the cursor is set to the letter O, various additional options are provided, which can be selected using the menu. For example, display contrast can be varied, and the device can be arranged to switch off automatically.

The symbols appearing at the bottom of the screen 13 are selected using the menu, to provide sophisticated control during voltage and current measurements.

After the letter V or A has been selected using the top cursor, a second cursor can be used to select one of the bottom functions.

When DC is selected, the DC content of an applied signal will be measured.

When DC-RMS is selected, tho true RMS value of DC, AC and complex waveforms can be measured.

When AC-RMS is selected, the true RMS value of the AC content of an applied signal can be measured.

When the letters PK are selected, real time sampling of the instantaneous waveform is performed over a period of 500 ms and the maximum excursion is displayed.

When the letters AV are selected, the DC and AC average of an applied signal is measured.

When HZ is selected, the frequency of the applied signal is measured.

It is a particular important feature of this device that it incorporates its own oscilloscope function. If the sine wave symbol is selected using the bottom cursor, the menu then requests the user to select a time base. The possibilities are 1 ms, 10 ms and 100 ms. The waveform of an applied sigma will then be shown on the liquid crystal display. At each display scaled graticule is presented, relating to the amplitude of the applied signal and the period.

Voltages applied to the instrument can be relatively high and reach dangerous levels. It is therefore important that the instrument should not be capable of delivering an analogue output while voltages are applied across the instrument. Existing instruments solve this problem by having connection sockets with a dual function. They can be used as input sockets, or output sockets, but not both. This, however, requires a complicated design of the sockets, and special input and output leads.

Figure 1:
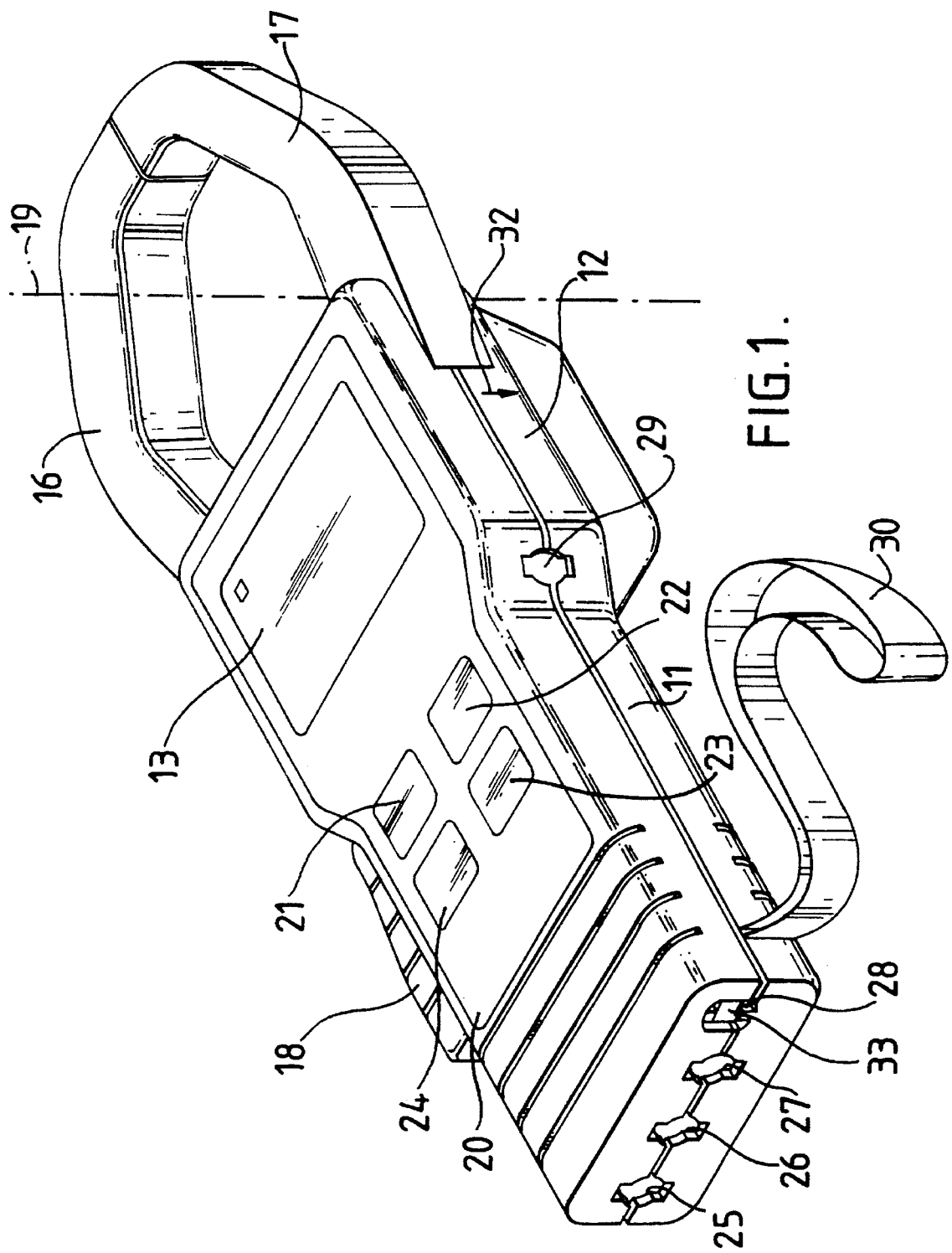
FIG. 1 is a perspective view of a hand-held clip-on ammeter according to the invention showing the from of the device, one side and one end.
Figure 2:
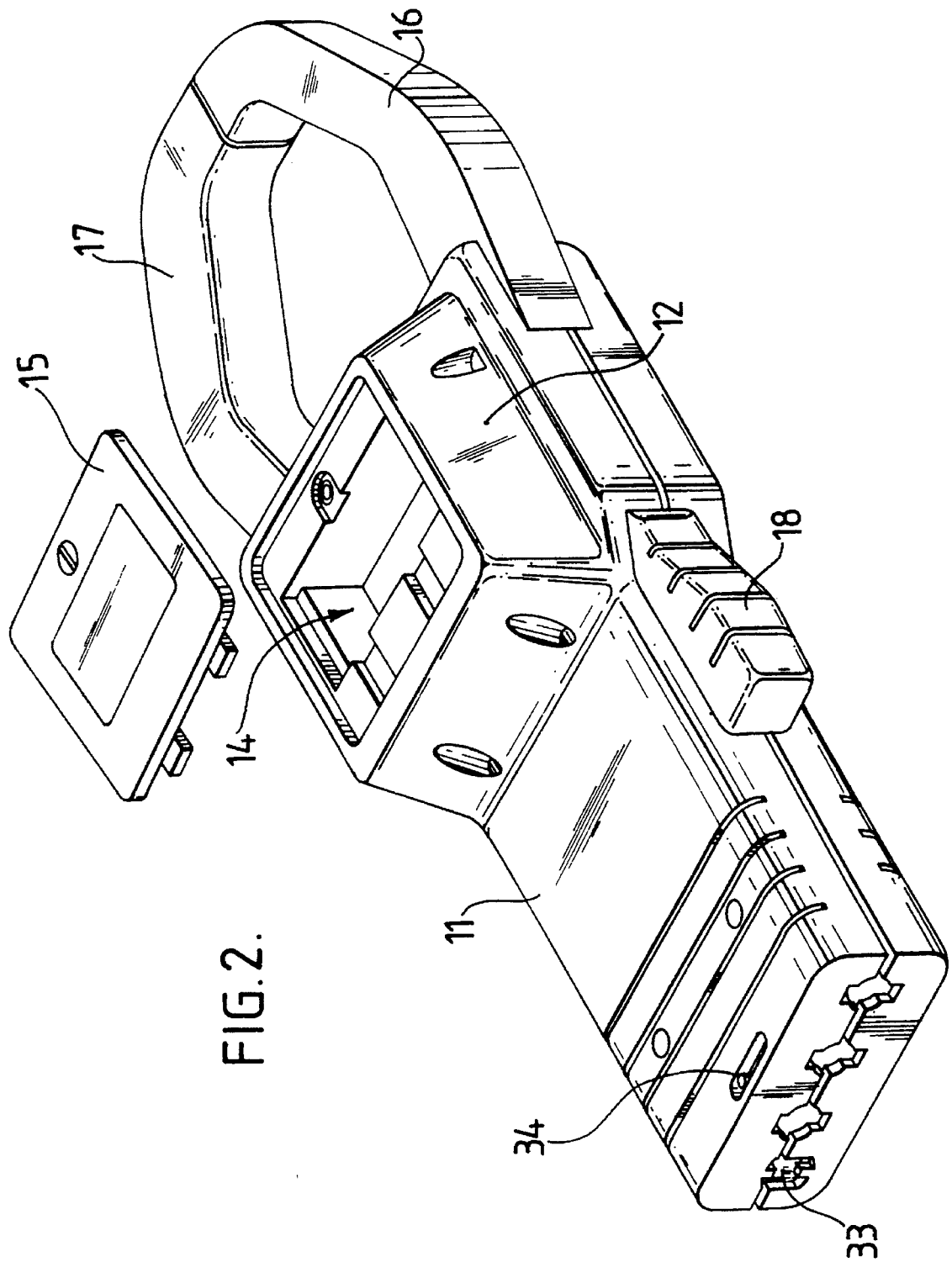
FIG. 2 is a perspective view of the device, showing the rear, the one end and the other side, a cover for a battery compartment being shown removed.

We have solved the problem in a much simpler manner, by fitting a sliding shutter within the casing part 11, adjacent to the sockets. In FIGS. 1 and 2, the shutter 33 is shown in a position in which it blanks off the analogue output socket 28, apertures in the shutter being in register with sockets 25, 26 and 27, so that they are exposed for use.

If it is desired to expose the analogue output socket 28, however, the shutter has to be moved to the side, by operation of a slide member 34, which can be seen in FIG. 2. Opening of the analogue output socket 28 automatically closes off the input sockets 25, 26 and 27. Thus, it is never possible to access both the input sockets and the analogue output scents sockets simultaneously.

On some occasions, it may be desirable to obtain an output signal, while the instrument is receiving input signals from some or all of the sockets 25, 26 and 27. The device according to the invention makes this possible, in a safe manner. It will be seen from FIG. 5 that the internal microprocessor control circuitry 10 is connected to an optical display device 35, containing infrared light emitting diodes. These produce digital optical signals related to the analogue signal. An optical sensing device 36 then picks up these signals and transmits the digital signals to the digital output socket 29. Thus, the only link between the circuitry 10 and the socket 29 is an optical link, and electrical isolation is achieved, which is an important safety factor. Any of the measured functions can be transmitted to the output socket 29, if desired.

Figure 4:
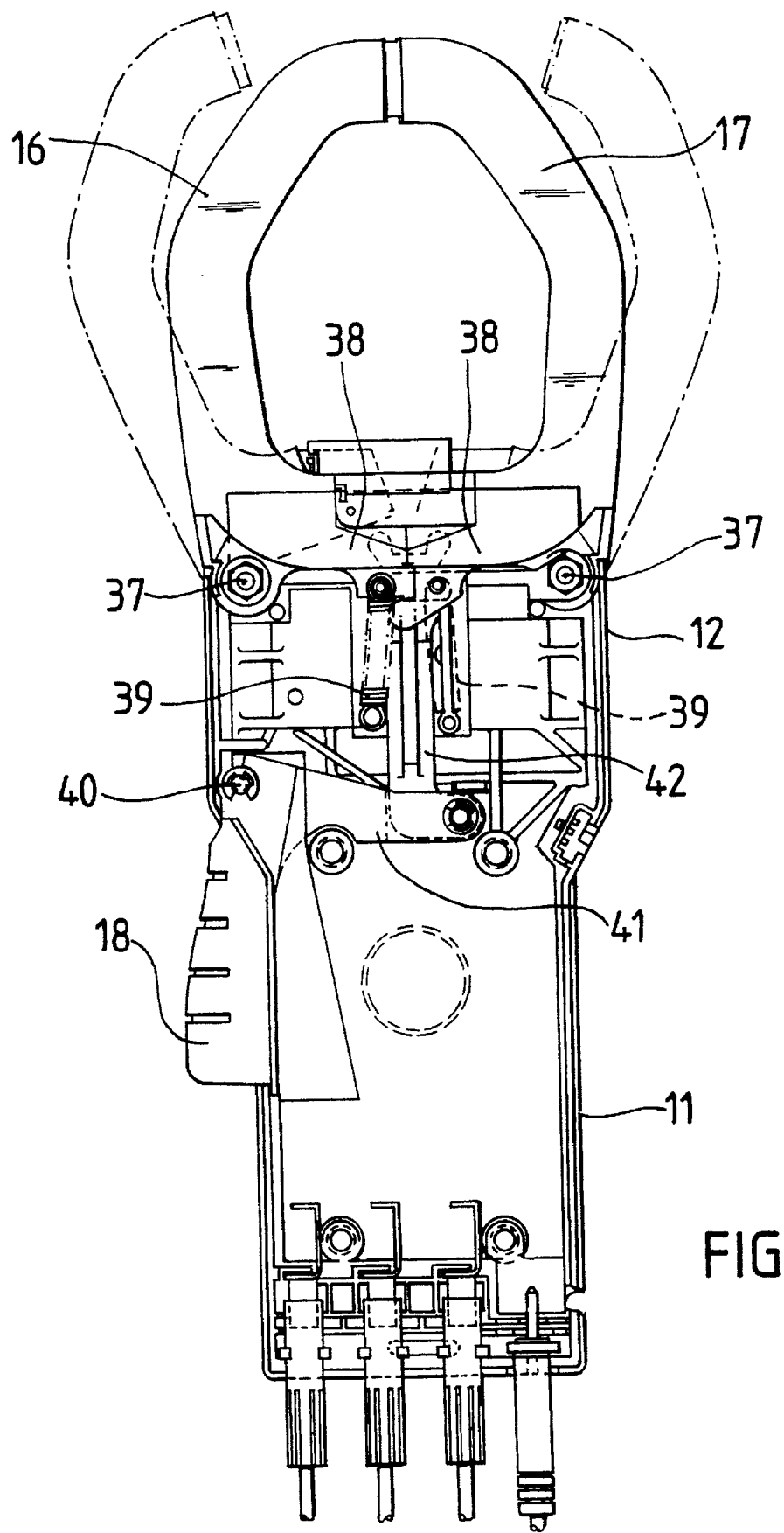
FIG. 4 is a front view of the device, shown partly in section.

The jaw mechanism will now be described in more detail, with particular reference to FIG. 4.

Each jaw 16, 17 is pivotally mounted at an associated pivot point 37. The two jaws have inwardly projecting arms 38 and tension springs 39 extend between the body of the device and these arms 38, biasing the jaws into the closed position, in which the free ends of the jaws make good contact. The trigger 18 is pivotally mounted at 40 and as an inwardly extending arm 41. Pivotally connected to the arm 41 is a yoke 42, which projects between the springs 39 and makes contact with the arms 38. When the trigger 18 is depressed, the yoke 42 presses on the arms 38, pivoting both jaws outwardly, against the action of the return springs.

When the device is in use, magnetic attraction tends to resist opening of the jaws. By using the mechanism shown, which acts on both jaws through a lever arm arrangement, good mechanical advantage is achieved, and in,spite of the magnetic attraction, even an operator with a relatively weak hand can open the jaws.

The use of the elongate yoke 42 makes it possible to position the trigger 18 well away from the jaws 16 and 17.

This means that the hand of the operator need never move near to the conductor being monitored, which is another safety feature.

The reader's attention is directed to all papers and documents which are filed concurrently with or previous to this specification in connection with this application and which are open to public inspection with this specifications, and the contents of all such papers and documents are incorporated herein by reference.

All of the features disclosed in this specification (including any accompanying claims, abstract and drawings), and/ or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the feature, disclosed in this specification including any-accompanying claims, abstract and drawings), or to any novel one, or any novel combination, of the steps of any method or process so disclosed.

I claim:

1. An electrical measuring device, comprising:

a housing;

measuring means attached to said housing, said measuring means disposed to fit around an electrical conductor for the measurement of a property associated with the conductor, said measuring means comprising a pair of jaws, with each jaw being mounted on the housing for movement with respect to the housing, said pair of jaws being configured such that the jaws can move toward and away from each other;

at least one manual operating member for moving the jaws, said operating member being,spaced away from the jaws to reduce a risk that a hand of an operator will come into contact with the conductor;

an intermediate member disposed between said operating member and said jaws, said intermediate member being movable to transmit opening and closing forces between said jaws and said operating member;

a plurality of connection terminals disposed in said housing, said plurality of connection terminals working in conjunction with a selection means for selecting at least one terminal to be accessible, with at least one other terminal inaccessible; and isolation means to isolate at least one output terminal of said plurality of connection terminals from the measuring means and electrically conductive components of the device, said isolation means thereby avoiding or reducing a risk that high voltages to which the measuring means are exposed will be transmitted to the output terminal.

2. An electrical measuring device as recited in claim 1, further comprising control circuitry coupled to said measuring means, said control circuitry generating a signal which is transmitted to said at least one output terminal through said isolating means.

3. An electrical measuring device as recited in claim 1, wherein each jaw of said measuring means is mounted on the housing by means of a pivot, and wherein each jaw has an inwardly extending lever arm wherein the intermediate member simultaneously contacts each lever arm to transmit opening and closing forces between the jaw and the operating member.

\* \* \* \* \*